(12) United States Patent
Lee et al.

(10) Patent No.: US 7,075,016 B2
(45) Date of Patent: Jul. 11, 2006

(54) UNDERFILLING EFFICIENCY BY MODIFYING THE SUBSTRATE DESIGN OF FLIP CHIPS

(75) Inventors: Hsin-Hui Lee, Kaohsiung (TW); Chao-Yuan Su, Koahsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 199 days.

(21) Appl. No.: 10/781,169

(22) Filed: Feb. 18, 2004

(65) Prior Publication Data
US 2005/0178581 A1  Aug. 18, 2005

(51) Int. Cl.
*H05K 1/00* (2006.01)

(52) U.S. Cl. ............. 174/250; 174/255; 174/260; 257/738

(58) Field of Classification Search ......... 174/260, 174/261, 52.4, 255; 361/760; 257/778, 257/787; 438/108, 126, 127
See application file for complete search history.

(56) References Cited

U.S. PATENT DOCUMENTS

| | | | |
|---|---|---|---|
| 5,329,423 A | * | 7/1994 | Scholz .............. 361/760 |
| 5,647,123 A | * | 7/1997 | Greenwood et al. .......... 29/840 |
| 5,697,148 A | * | 12/1997 | Lance et al. ............. 29/840 |
| 5,990,545 A | | 11/1999 | Schueller et al. .......... 257/697 |
| 6,414,849 B1 | | 7/2002 | Chiu ................ 361/760 |
| 6,570,261 B1 | | 5/2003 | Farquhar et al. .......... 257/778 |
| 6,600,217 B1 | * | 7/2003 | Onodera et al. .......... 257/667 |
| 6,772,512 B1 | * | 8/2004 | Tsai et al. ............. 29/840 |
| 6,777,814 B1 | * | 8/2004 | Iwasaki et al. .......... 257/778 |
| 2002/0011656 A1 | | 1/2002 | Swanson et al. .......... 257/697 |

* cited by examiner

*Primary Examiner*—Ishwar (I. B.) Patel
(74) *Attorney, Agent, or Firm*—Thomas, Kayden, Horstemeyer & Risley

(57) ABSTRACT

A substrate structure including a substrate with solder bumps on a main region and a peripheral region of a front side thereof; a solder mask is formed over the front side of the substrate; and a metal trace structure formed within the solder mask. The metal trace structure including a channel therein for the receipt of underfill. The metal trace structure further including a central portion with arms radiating outwardly therefrom, dividing the solder mask into separate areas. A method of underfilling a chip wherein a chip having a pattern of solder bumps formed on the underside of the chip is placed underside first onto the metal trace structure of the present invention. The solder bump pattern includes openings over the metal trace structure. Underfill is introduced into the metal trace structure so that the underfill flows from the metal trace structure and between the solder bumps to underfill the chip.

16 Claims, 6 Drawing Sheets

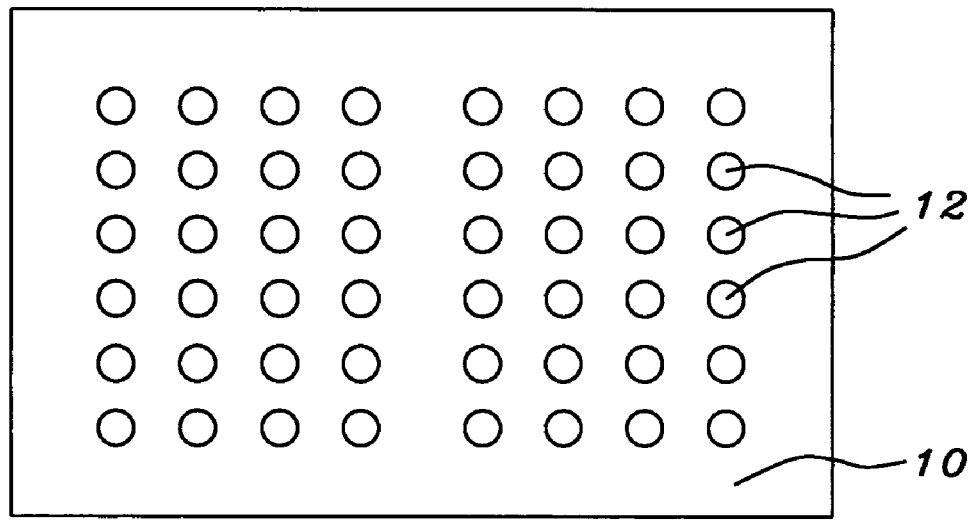
FIG. 1 – Prior Art
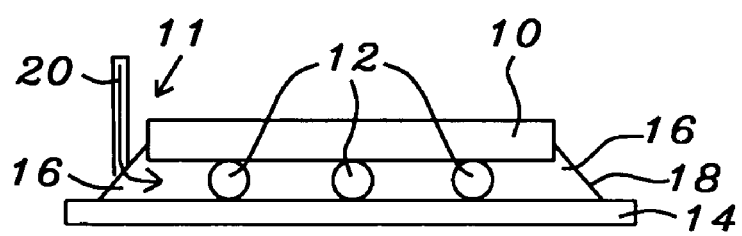
FIG. 2 – Prior Art

UNDERFILLING EFFICIENCY BY MODIFYING THE SUBSTRATE DESIGN OF FLIP CHIPS

BACKGROUND OF THE INVENTION

FIGS. 1 and 2 illustrate the current substrate 14 design. The current substrate 14 design suffers from a long underfilling cycle time to underfill a chip 10 of, for example, a flow time of about 260 seconds and a self-fillet time of about 570 seconds for a total time of about 830 seconds at about 75° C.

FIG. 1 illustrates a die/chip 10 having solder bumps 12 affixed to the bottom thereof.

FIG. 2 illustrates the die/chip 10 affixed to a substrate 14 and an underfill 16 is injected along the side 11 of the die/chip 10/substrate 14 through dispensing port 20, to underfill the die/chip 10 and create a self-fillet 18. As noted above, this die/chip 10 underfilling time is long and creates a bottleneck in the process flow.

This long underfilling time is due to a low flow rate of the underfill 16 on the solder mask surface and/or underfill voids caused because of air trapped underneath the die/chip 10.

U.S. Pat. No. 6,470,261 B1 to Ng et al. describes an automatic freeway incident detection system and method using artificial neural network and genetic algorithms.

U.S. Pat. No. 5,990,545 to Schueller et al. describes a chip scale ball grid array for integrated circuit package.

U.S. Pat. No. 6,414,849 B1 to Chiu describes a low stress and low profile cavity down flip chip and wire bond BGA package.

U.S. Patent Application Publication No. US 2002/0011656 A1 to Swanson et al. describes a semiconductor device protective overcoat with enhanced adhesion to polymeric materials and method of fabrication.

SUMMARY OF THE INVENTION

Accordingly, it is an object of one or more embodiments of the present invention to provide an improved substrate design for underfilling chips.

Other objects will appear hereinafter.

It has now been discovered that the above and other objects of the present invention may be accomplished in the following manner. Specifically, (I) a substrate structure comprises a substrate; a solder mask is formed over the substrate; and a metal trace structure formed within the solder mask. The metal trace structure including a channel therein for the receipt of underfill. The metal trace structure further including a central portion with arms radiating outwardly therefrom, dividing the solder mask into separate areas. (II) A method of underfilling a chip wherein a chip having a pattern of solder bumps formed on the underside of the chip is placed underside first onto the metal trace structure of the present invention. The solder bump pattern including openings over the metal trace structure. Underfill is introduced into the metal trace structure so that the underfill flows from the metal trace structure and between the solder bumps to underfill the chip.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 and 2 schematically illustrate the prior art structure and method of underfilling semiconductor chips.

DETAILED DESCRIPTION OF THE PREFERRED EMBODIMENT

Figure 3:
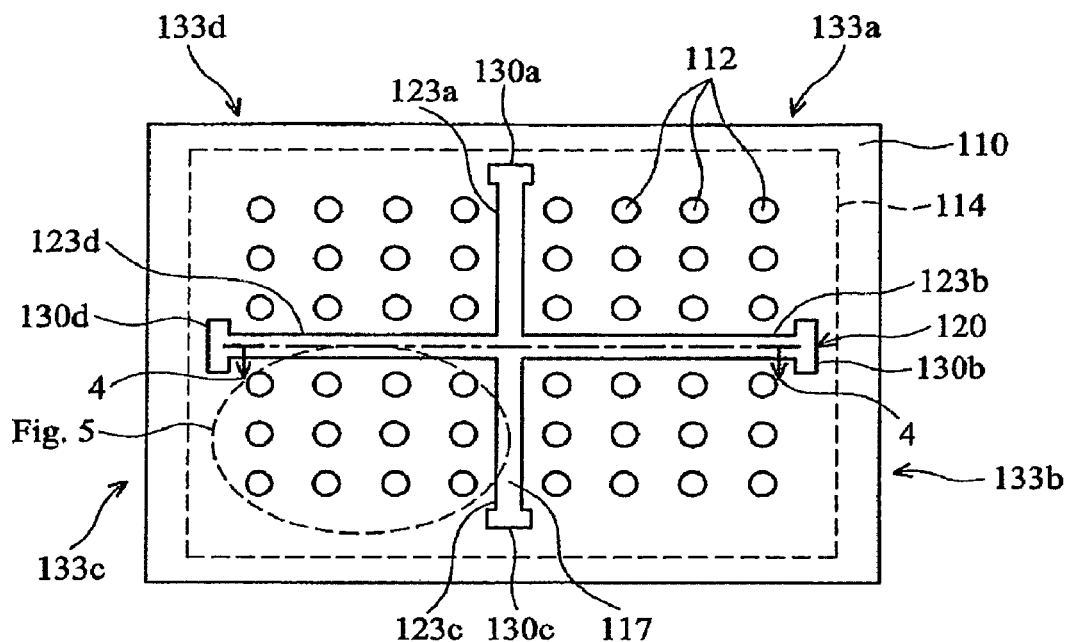
FIGS. 3 to 5 schematically illustrate a first preferred embodiment of the present invention.
Figure 4:
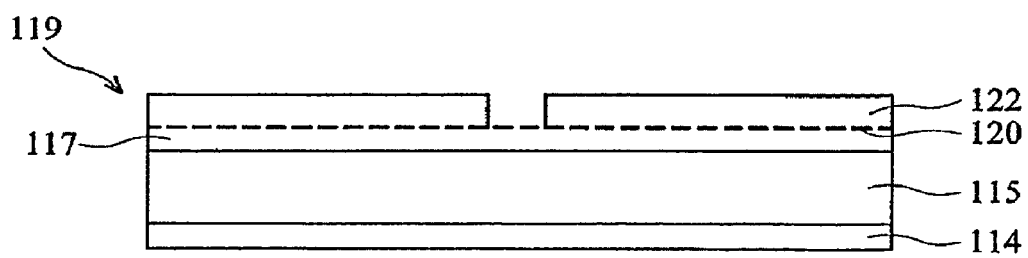
Figure 5:
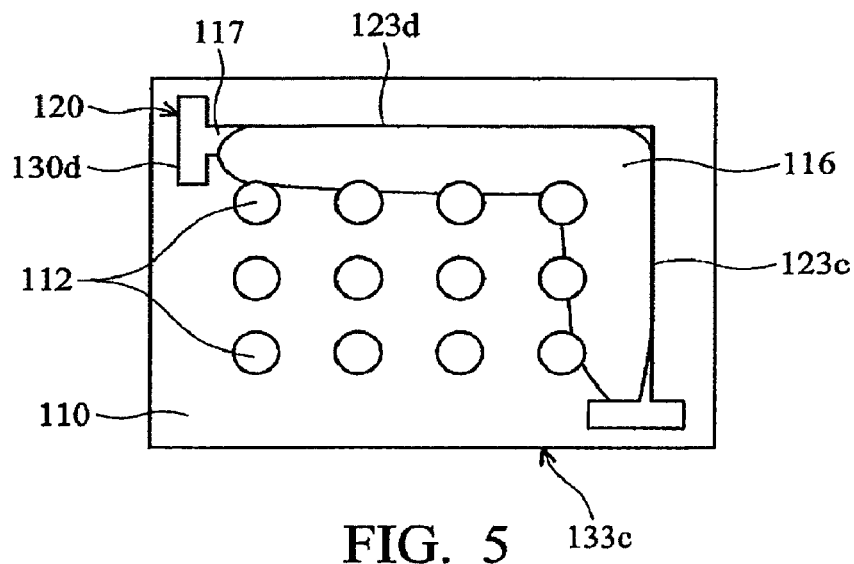

First Preferred Embodiment—FIGS. 3 to 5

FIGS. 3 to 5 illustrate the first preferred embodiment of the present invention wherein a metal trace structure 120 is formed within the solder mask 122, displacing one or more rows of solder bumps 112. The metal trace structure 120 including a channel 117 therein for the receipt of underfill 116 which flows by capillary action.

Figure 9:
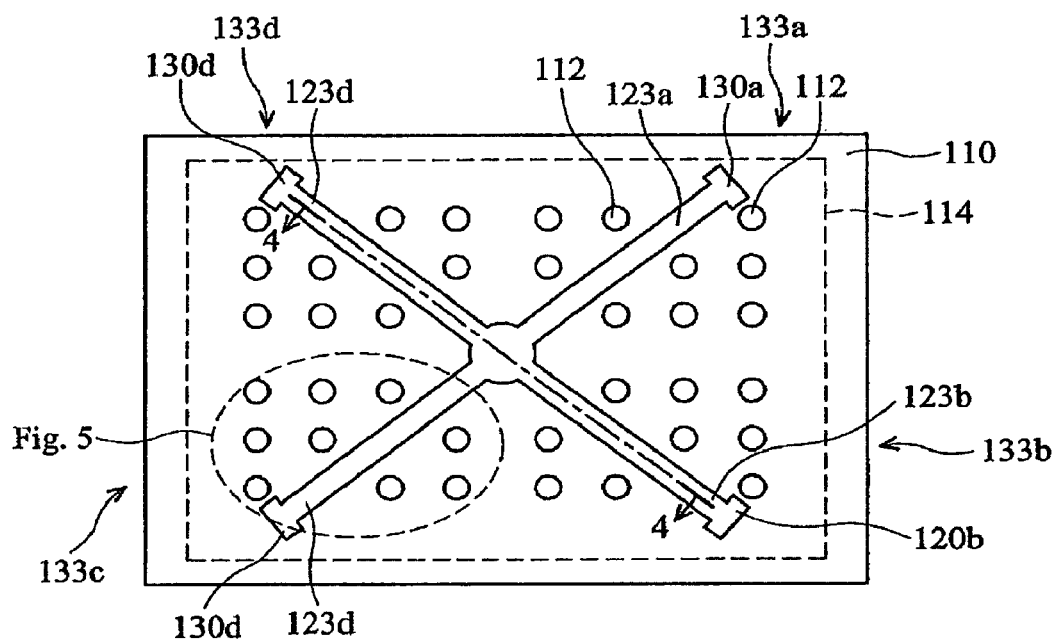
FIGS. 9 and 10 illustrate X-shaped structures.

While a cross-shaped metal trace structure 120 is illustrated, other shaped metal trace structures 120 are permissible, such as an X-shaped structure as illustrated in FIG. 9.

For ease of understanding, FIG. 3 is a bottom up, plan view of the substrate 114 with the dashed line showing the die/chip 110 to be placed upon the substrate 114.

Chip 110 may be a flip-chip/flip-chip ball grid array (BGA).

As shown in FIG. 4 (which is a cross-sectional view of substrate structure 119) the metal trace structure 120 including a channel 117 therein is actually formed within the solder mask 122 over the substrate 114)/115). The cross-shaped metal trace structure 120 illustrated in FIG. 3 includes arms 123a, 123b, 123c 123d terminating in respective ends 130a, 130b, 130c, 130d. As shown in FIG. 3, ends 130a–d may be T-shaped to permit better egress of underfill 116 therein.

It is through this metal trace structure 120 which the underfill 116 flows. Underfill 116 is roughly simultaneously introduced into metal trace structure 120 through its T-shaped ends 130a–d and flows through metal trace structure arms 123a–d and around solder bumps 112 of die/chip 110 as shown in FIG. 5 (which shows just quadrant/block 133c of FIG. 3). Since the underfill 116 flows from the inside-out of the structure of solder bumps 112 on the die/chip 110 simultaneously from the four quadrants or blocks 133a–d, the overall flow rate of the underfill 116 is markedly increased to decrease the underfilling cycle time as compared to the conventional structure/process. This also substantially eliminates any underfill 116 voids between the solder bumps 112 as any air is pushed outwardly and is not trapped by the encroaching underfill 116 due to the first embodiment design of the instant invention.

The inventors have determined that the underfilling cycle using the first embodiment metal trace structure 120 of the present invention has been shortened from preferably about 830 to 260 seconds and more preferably about 80 seconds.

Because the first embodiment metal trace structure 120 is formed of metal, the temperature of the underfill 116 is better maintained to permit better flow of underfill 116 through metal trace structure 120 and hence around the solder bumps 112 of the die/chip 110. The metal trace structure 120 is first raised to a temperature of preferably from about 25 to 90° C. and then the underfill 116 is introduced.

Second Preferred Embodiment—FIGS. 6 to 9

Figure 6:
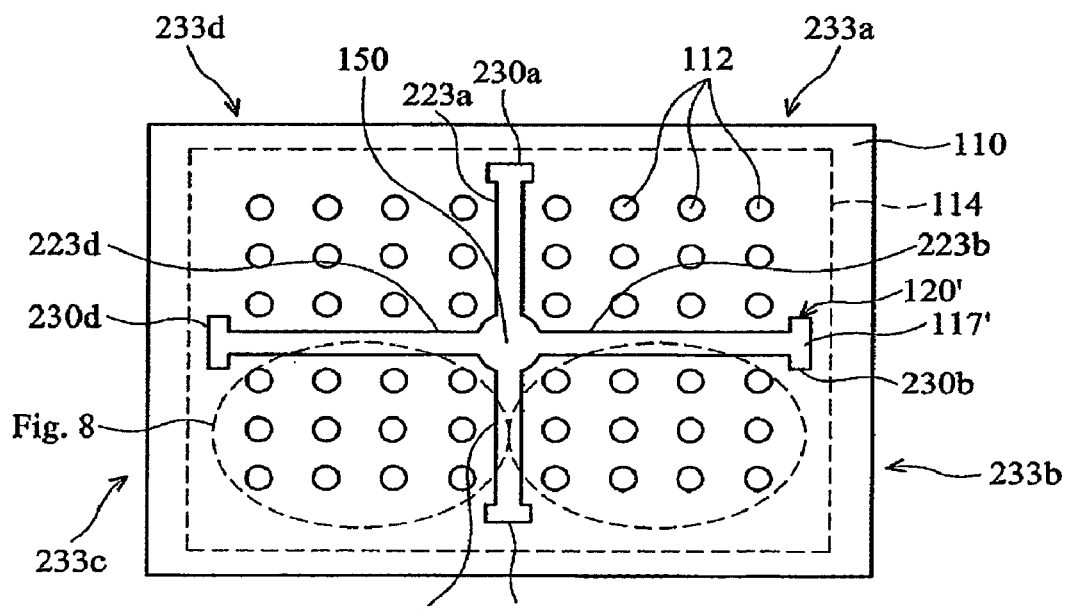
FIGS. 6 to 8 schematically illustrate a second preferred embodiment of the present invention.
Figure 7:
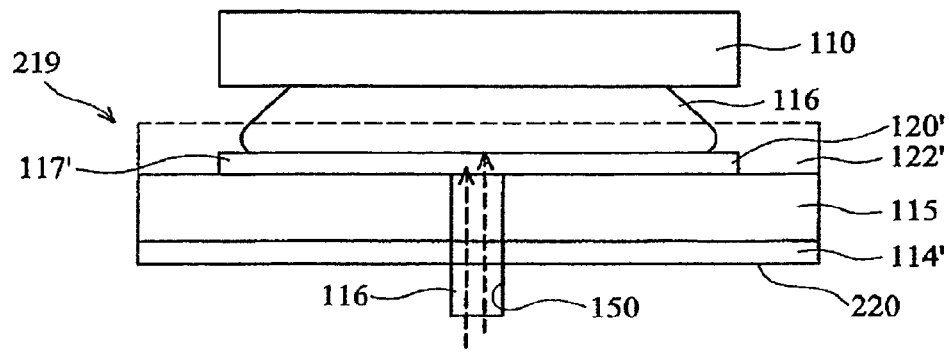
Figure 8:
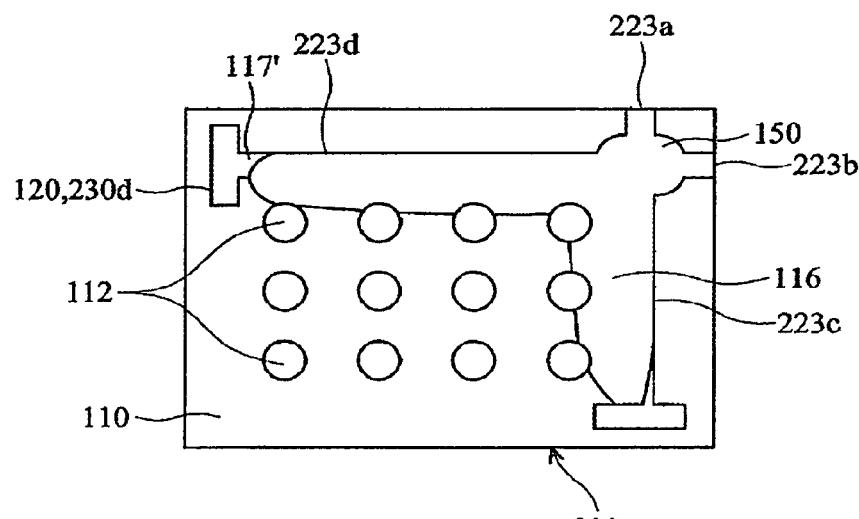

FIGS. 6 to 8 illustrate the second preferred embodiment of the present invention wherein a metal trace structure 120' is formed within the solder mask 122', displacing one or more rows of solder bumps 112. The metal trace structure 120' including a channel 117' therein for the receipt of underfill 116 which flows by capillary action.

Figure 10:
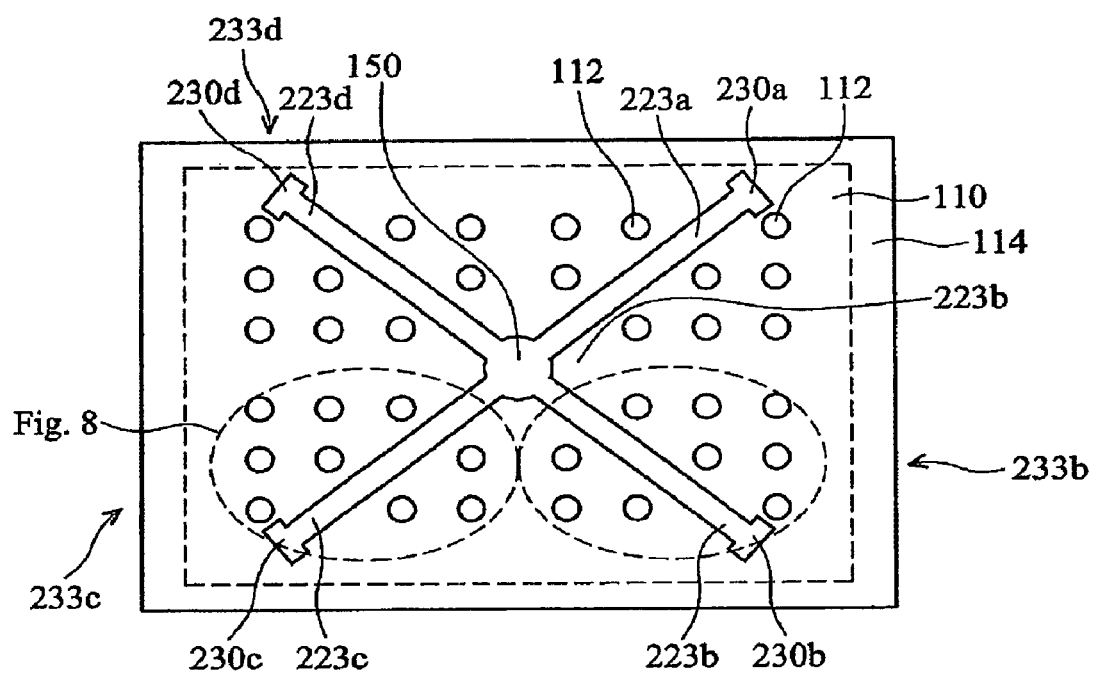

Again, as with the first embodiment, while a cross-shaped metal trace structure 120' is illustrated, other shaped metal trace structures 120' are permissible, such as an X-shaped structure as illustrated in FIG. 10.

The second embodiment shaft metal trace structure 120' of the present invention is substantially identical to the first embodiment metal trace structure 120 but with the addition of metal trace opening/shaft 150 roughly in the center of the substrate structure 219 permitting inflow of underfill 116 from the underside 220 of substrate structure 219 through opening/shaft 150, into the metal trace structure arms 223a, 223b, 223c, 223d, through metal trace structure arms 223a–d and out from the metal trace arms 223a–d and around solderbumps 112.

For ease of understanding, FIG. 6 is a bottom up, plan view of the substrate 114 with the dashed line showing the die/chip 110 to be placed upon the substrate 114.

Chip 110 may be a flip-chip/flip-chip ball grid array (BGA).

As shown in FIG. 7 (which is a cross-sectional view of substrate structure 219 with die/chip 110 positioned thereover) the shaft metal trace structure 120' is actually formed within the solder mask 122 over the substrate 114 (/115).

The cross-shaped shaft metal trace structure 120' illustrated in FIG. 6 includes arms 223a, 223b, 223c, 223d terminating in respective ends 230a, 230b, 230c, 230d. As shown in FIG. 6, ends 230a–d may be T-shaped to permit better egress of underfill 116 therein although is not necessary in the second embodiment cross-shaped shaft metal trace structure 120' since the underfill is introduced through metal trace opening/shaft 150.

It is through this metal trace structure 120 which the underfill 116 flows. As noted above, underfill 116 is introduced into shaft metal trace structure 120' through its central opening/shaft 150 and flows through metal trace structure arms 223a–d and around solder bumps 112 of die/chip 110 as shown in FIG. 8 (which shows just quadrant/block 233c of FIG. 6). Since the underfill 116 flows from the inside-out of the structure of solder bumps 112 on the die/chip 110 roughly simultaneously from the four quadrants or blocks 233a–d, the overall flow rate of the underfill 116 is markedly increased to decrease the underfilling cycle time as compared to the conventional structure/process. This also substantially eliminates any underfill 116 voids between the solder bumps 112 as any air is pushed outwardly and is not trapped by the encroaching underfill 116 due to the second embodiment design of the of the instant invention.

The inventors have determined that the underfilling cycle using the second embodiment metal trace structure 120' of the present invention has been shortened from preferably about 720 to 100 seconds and more preferably about 60 seconds. Because the second embodiment metal trace structure 120' is formed of metal, the temperature of the underfill 116 is better maintained to permit better flow of underfill 116 through metal trace structure 120' and hence around the solder bumps 112 of the die/chip 110. The metal trace structure 120' is first raised to a temperature of preferably from about 25 to 90° C. and then the underfill 116 is introduced.

ADVANTAGES OF THE PRESENT INVENTION

The advantages of one or more embodiments of the present invention include:
1. shortening of the underfill time; and
2. prevention of underfill void underneath the die.

While particular embodiments of the present invention have been illustrated and described, it is not intended to limit the invention, except as defined by the following claims.

We claim:

1. A substrate structure, comprising: a substrate with solder bumps on a main region and a peripheral region of a front side thereof; a solder mask formed over the front side of the substrate, wherein the solder bumps are exposed; and a metal trace structure formed within the solder mask; the metal trace structure including a channel therein for the receipt of underfill; the metal trace structure further including a central portion with arms radiating outwardly therefrom, dividing the solder mask into separate areas.

2. The structure of claim 1, wherein the arms each include a distal end.

3. The structure of claim 1, wherein the solder mask includes a series of solder bumps.

4. The structure of claim 1, wherein the solder mask includes a series of solder bumps not over the metal trace structure.

5. The structure of claim 1, wherein the metal trace structure is a cross shape or an X-shape.

6. The structure of claim 1, wherein the metal trace structure is a cross shape.

7. The structure of claim 1, wherein the arms each include a distal end wherein the distal ends of the respective arms receive the underfill.

8. The structure of claim 1, wherein the arms each include a T-shaped distal end wherein the T-shaped distal ends of the respective arms receive the underfill.

9. The structure of claim 1, wherein the central portion of the metal trace structure includes a shaft disposed on a backside of the substrate, wherein the channel is in communication with the shaft to receive the underfill.

10. A substrate structure, comprising: a substrate with solder bumps on a main region and a peripheral region of a front side thereof; a solder mask formed over the front side of the substrate, wherein the solder bumps are exposed; and a metal trace structure formed within the solder mask; the solder mask including the solder bumps not over the metal trace structure; the metal trace structure including a channel therein for the receipt of underfill; the metal trace structure further including a central portion with arms radiating outwardly therefrom, dividing the solder mask into separate areas.

11. The structure of claim 10, wherein the arms each include a distal end.

12. The structure of claim 10, wherein the metal trace structure is a cross shape or an X-shape.

13. The structure of claim 10, wherein the metal trace structure is a cross shape.

14. The structure of claim 10, wherein the arms each include a distal end wherein the distal ends of the respective arms receive the underfill.

15. The structure of claim 10, wherein the arms each include a T-shaped distal end wherein the T-shaped distal ends of the respective arms receive the underfill.

16. The structure of claim 10, wherein the central portion of the metal trace structure includes a shaft disposed on a backside of the substrate, wherein the channel is in communication with the shaft to receive the underfill.

* * * * *